Dec. 23, 1969 J. E. MANN ET AL 3,485,684

DISLOCATION ENHANCEMENT CONTROL OF SILICON BY INTRODUCTION OF LARGE DIAMETER ATOMIC METALS

Filed March 30, 1967

INVENTORS.
JOHN E. MANN,
PERRIN WALKER,
BY THEIR ATTORNEYS
Spensley & Horn.

United States Patent Office 3,485,684

Patented Dec. 23, 1969

3,485,684

DISLOCATION ENHANCEMENT CONTROL OF SILICON BY INTRODUCTION OF LARGE DIAMETER ATOMIC METALS

John E. Mann, Azusa, and Perrin Walker, Redondo Beach, Calif., assignors to TRW Semiconductors, Inc., Lawndale, Calif., a corporation of Delaware Filed Mar. 30, 1967, Ser. No. 627,022

Int. Cl. H01l 7/44

U.S. Cl. 148—187 16 Claims

ABSTRACT OF THE DISCLOSURE

A method of controlling dislocation enhancement and propagation in semiconductive crystals by introduction of large diameter atoms of heavy metals into the crystal lattice. When the semiconductive crystal is silicon, and the dopant to be used is phosphorus or boron, a heavy metal atom having a diameter greater than that of phosphorus or boron is diffused into the silicon wafer. One such element is nickel. Nickel is electroless plated on a silicon wafer and is diffused into the wafer at 1000° C. for 10–15 minutes. The wafer is then processed with dopant and is surface passivated with a thermally grown layer of silicon dioxide.

BACKGROUND OF THE INVENTION

Field of the invention

This invention relates to a method of controlling dislocation enhancement occurring in crystals of semiconductive materials. More specifically, the invention relates to a method of diffusing heavy metal elements into a silicon crystal to stabilize the crystal lattice against dislocation enhancement during a subsequent thermal oxidation of the crystal. The invention also relates to atomic lattice-level interaction of heavy metal elements with impurity elements grown into the original silicon wafer lattice at substitutional or interstitial points.

Description of the prior art

It has been observed that during the process of thermally growing a silicon dioxide coating on a silicon wafer that dislocation enhancement and propagation occurs when silicon atoms are removed from the silicon crystal lattice by oxidation occurring at the surface of the wafer to form a silicon dioxide coating. This generally occurs during surface passivation of the silicon wafer. Dislocations can also occur when a silicon wafer is placed in a radiation environment such as electron or neutron bombardment. Dislocations are formed in the crystal lattice at those positions from which silicon atoms migrated. It is well known that diffusion proceeds preferentially along dislocations associated with crystallographic planes, in the case of silicon, primarily the (111)<110>. In general, the strain system around the dislocation varies from compression on one side of the dislocation to expansion on the other. These will cause an impurity to diffuse more quickly along the dislocation line than in the body of the material. The magnitude of this effect will depend upon the particular solvent crystal and the solute impurity involved. The resulting structure has a high impurity concentration gradient p-n junction in the neighborhood of the dislocation or dislocation zone. Thus, the electrical characteristics of the device are affected. Prior art methods of removing an undesirable dislocation are to either mechanically lap the wafer until the dislocation is removed or to etch the wafer until the dislocation is removed. In both instances the surface passivating coating has to be removed which defeats the purpose of passivating the surface and device junction against external contamination.

Accordingly, it is an object of the present invention to provide a method of controlling dislocation enhancement in a crystal structure and to still retain the surface passivation layer.

It is another object of the present invention to provide a method of controlling dislocation enhancement in a crystal structure by heavy metals gettering.

Yet another object of this invention is to control dislocation enhancement in a silicon crystal by diffusing large diameter heavy metal atoms into the crystal lattice.

Still another object of this invention is to further stabilize the internal silicon lattice against subsequent radiation induced damage.

SUMMARY OF THE INVENTION

In one of its broadest aspects the present invention provides a method for controlling dislocation enhancement in a crystal comprising the steps of: disposing a layer of a heavy metal on the surface of a wafer of semiconductive material, the atoms of the heavy metal being larger in diameter than those of a dopant material used in the doping of the semiconductor device; and diffusing atoms of the heavy metal into the wafer of semiconductive material. The doping and surface passivation of the crystal can then be carried out in the normal manner.

The advantages of the invented method are that dislocation enhancement in a crystal is reduced and, therefore, the electrical characteristics of a semiconductive device remain more constant and predictable. Furthermore, no mchanical lapping or etching to remove dislocations is required; the surface passivating coating, therefore, never has to be removed from the surface of a crystal.

The novel features which are believed to be characteristic of the invention, both as to its organization and method of operation, together with further objects and advantages thereof will be better understood from the following description considered in connection with the accompanying drawing in which a presently preferred embodiment of the invention is illustrated by way of example. It is to be expressly understood, however, that the drawing is for the purpose of illustration and description only, and is not intended as a definition of the limits of the invention.

DESCRIPTION OF THE PREFERRED EMBODIMENT

Dislocation enhancement and propagation has been observed in silicon wafers following silicon dioxide surface passivation. This phenomenon is thought to occur when silicon atoms are removed from the silicon lattice by the surface oxidation of the silicon wafer or by radiation bombardment by particles such as electrons and neutrons. Removal of silicon atoms from the crystal lattice can induce lattice collapse with detrimental effects upon the electrical characteristics of the semiconductor device. Actual dislation propagation enhancement above background dislocation content has been verified by dislocation etching. Heavy metals gettering (diffusion) has been found to be an effective means of counter-doping the silicon lattice to reduce or to eliminate this effect by stabilizing the lattice by inclusion of element atoms of larger diameter than dopant atoms. It is thought that the large diameter atoms enter into available lattice sites as well as interstitially and when the silicon wafer is later subjected to silicon dioxide oxidation, the nickel atoms available counteract lattice collapse as silicon atoms are removed during formation of $SiO_2$.

Dislocations, of course, also occur in other crystalline structures such as, for example, germanium. Further processing of the wafers i.e., doping and surface passivation, sometimes causes dislocation enhancement. As has been previously mentioned, dislocations can occur when a crystal is exposed to radiation such as electron or neutron bombardment. Diffusion of large diameter heavy metal atoms into such a crystal lattice counteracts lattice collapse; thus, the invented method is applicable to any semiconductor crystal structure which is susceptible to dislocation enhancement.

Although not limited thereto, the present invention has been found to be particularly suited to stabilizing silicon lattices against dislocation enhancement and will accordingly be described in connection with such use.

Figure 1A:
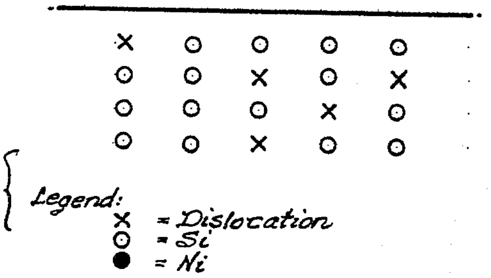
FIGURES 1A–1C show schematically atom locations in a crystal structure and reduction of dislocations by the addition of large atomic diameter elements.

Referring now to FIGURE 1A, a silicon wafer in cross section is shown containing a number of background dislocations. The wafer is lapped to size and etch polished to remove surface contamination by standard methods.

Figure 2A:
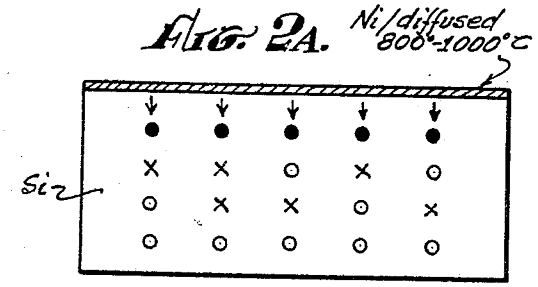
FIGURES 2A and 2B show schematically nickel being diffused into a silicon wafer.

Next, a layer of a heavy metal element is deposited upon the surface of the silicon wafer as shown schematically in FIGURE 2A. The heavy metal element is selected upon the basis of its atomic diameter; the element diffused into the silicon wafer should have an atomic diameter larger than that of the dopant element. The metal should be one that does not affect the conductivity type or conductivity characteristics of the wafer and therefore cannot be classified as a dopant such as the Group III and Group V elements of the Periodic Table. In the use of the invented method to stabilize the silicon crystal the element used is nickel when the dopant species is phosphorus and/or boron. It is, of course, within the scope of the invention to use heavy metal atoms other than nickel depending on the particular impurity (dopant) that is to be diffused into the silicon wafer. Other elements that can be used are chromium, iron and copper. In Table I are shown several heavy metals and their atomic diameters. In Table II are shown several dopants and their atomic diameters, however, any of the elements from Group III and Group V of the Periodic Table may be utilized as suitable dopants. In Table III the atomic diameter of silicon and germanium are shown although any Group IV semiconductive material can be utilized in this invention:

TABLE I

| Element | Atomic Radius, A. | Atomic Diameter, A. |
|---|---|---|
| Ag | 1.444 | 2.888 |
| Au | 1.441 | 2.882 |
| Co | 1.248 | 2.496 |
| Cr | 1.249 | 2.496 |
| Cu | 1.278 | 2.558 |
| Fe | 1.241 | 2.482 |
| Ni | 1.245 | 2.49 |
| Zn | 1.3324 | 2.6648 |

TABLE II

| Element | Atomic Radius, A. | Atomic Diameter, A. |
|---|---|---|
| Al | 1.431 | 2.862 |
| As | 1.25 | 2.50 |
| B [a] | 0.97 | 1.94 |
| Ga | 1.2185 | 2.437 |
| In | 1.625 | 2.25 |
| P [a] | 0.93 | 1.86 |
| Sb | 1.45 | 2.90 |
| O [b] | 0.60 | 1.20 |

[a] Primary diffusant elements in forming p-n junctions in silicon.

[b] A normal impurity always found in silicon, approximately $5\times10^{18}$ in Czochralski grown, and $5\times10^{16}$ in Float Zone grown crystals.

TABLE III

| Element | Atomic Radius, A. | Atomic Diameter, A. |
|---|---|---|
| Ge | 1.2245 | 2.449 |
| Si | 1.175 | 2.35 |

The surface of the wafer is prepared for the deposition of nickel by etching or sandblasting. Nickel can be deposited by electroless plating or by vacuum evaporation and deposition. A nickel layer approximately 1000 A. thick is deposited upon the wafer surface.

Figure 1B:
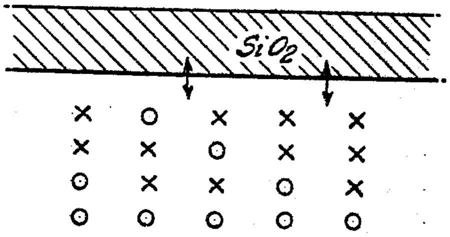
Figure 2B:
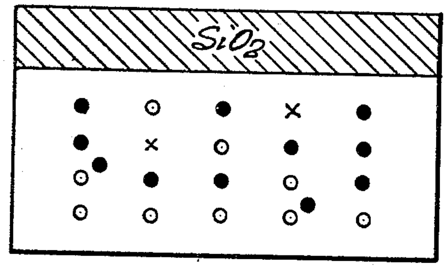
Figure 1C:
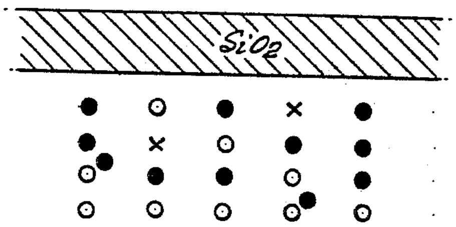

The nickel is next diffused at 800° C. for 30–40 minutes and/or at 1000° C. for 10–15 minutes into the silicon wafer as is schematically shown in FIGURE 2A. The resulting nickel atoms in the silicon crystal are schematically shown in FIGURE 2B. After the heavy metal gettering the wafer is processed by standard techniques to obtain the desired junction configuration and to produce a semiconductor device. Any desired p-n junction configuration can be formed by proper doping such as $n^+$-n-p, n-p-n, $p^+$-p-n or p-n-p. First the doping operation is carried out with a dopant such as phosphorus and/or boron which has an atomic diameter smaller than that of the heavy metal atom used for diffusion. Other suitably sized dopants can be used with appropriately sized heavy metals. Surface passivation can then be carried out by thermally growing an oxide layer (e.g. $SiO_2$) or a nitride layer on the silicon wafer. FIGURES 1A–1C show schematically the effect upon a silicon crystal of counter-doping the crystal with nickel prior to the normal doping and surface passivation processes.

As has been previously explained, it is thought that the nickel atoms enter the silicon lattice and also enter the wafer interstitially. When the wafer is later subjected to $SiO_2$ oxidation for example the nickel atoms available counteract lattice collapse (dislocation enhancement) as silicon atoms are removed during formation of $SiO_2$. Metallic ohmic contacts may be formed on said device by standard techniques. Also, if desired a final passivation layer can be deposited over the contacts and surface of the semiconductor wafer to provide additional radiation hardening of the device.

Thus, from the above-described process, it is apparent that dislocations in a silicon wafer can be controlled without the necessity for any prior art techniques such as mechanical lapping and etching to remove the dislocated zone. The protective oxide surface on a silicon wafer therefore never has to be removed and the electrical characteristics of a semiconductor device can be improved dramatically. It has further been found that dislocation enhancement due to radiation is reduced when heavy metal gettering techniques are used on semiconductor crystals such as silicon and germanium.

Although this invention has been disclosed and illustrated with reference to particular applications, the principles involved are susceptible of numerous other applications which will be apparent to persons skilled in the art. The invention is, therefore, to be limited only as indicated by the scope of the appended claims.

What is claimed is:

1. A method of controlling dislocation enhancement in a semiconductor device comprising the steps of:

disposing a layer of a metal on the surface of a wafer of a Group IV semiconductive material, the atoms of said metal being larger in diameter than those of a dopant material to be used in a subsequent doping of the semiconductor device;

diffusing atoms of said metal into said wafer of semiconductive material; and passivating the surface of said wafer by thermally growing a passivating layer.

2. The method as defined in claim 1, wherein the heavy metal element is selected from the group consisting of Ag, Au, Co, Cr, Cu, Fe, Ni and Zn.

3. A method of controlling dislocation enhancement in a semiconductor device comprising the steps of:
disposing a layer of a metal on the surface of a wafer of a Group IV semiconductive material, the atoms of said metal being larger in diameter than those of a dopant material used in the doping of the semiconductor device;
diffusing atoms of said metal into said wafer of semiconductive material;
producing at least one p and n junction in said wafer of semiconductive material by diffusing into said wafer; and
passivating the surface of said wafer by thermally growing a passivating layer.

4. The method as defined in claim 3, wherein the heavy metal element is selected from the group consisting of Ag, Au, Co, Cr, Fe, Ni and Zn.

5. A method of controlling dislocation enhancement in a semiconductor device comprising the steps of:
disposing a layer of a heavy metal on the surface of a wafer of a Group IV semiconductive material, the atoms of said heavy metal being larger in diameter than those of a dopant material used in the doping of the semiconductor device;
diffusing atoms of said heavy metal into said wafer of semiconductive material;
diffusing said wafer of semiconductive material with at least one dopant material to produce adjacent zones having different electrical characteristics; and
passivating the surface of said wafer by thermally growing a passivating layer.

6. The method as defined in claim 5, wherein said heavy metal is disposed upon the surface of said semiconductive material by electroless plating.

7. The method as defined in claim 5, wherein said heavy metal is disposed upon the surface of said semiconductive material by vacuum evaporation and deposition.

8. The method as defined in claim 5, wherein the heavy metal element is selected from the group consisting of Ag, Au, Co, Cr, Fe, Ni and Zn.

9. A method of controlling dislocation enhancement in a semiconductor device comprising the steps of:
disposing a layer of heavy metal on the surface of a wafer of a Group IV semiconductive material, the atoms of said heavy metal being larger in diameter than those of a dopant material used in the doping of the semiconductor device;
diffusing atoms of said heavy metal into said wafer of semiconductive material;
diffusing said wafer of semiconductive material to produce zones having at least one junction;
passivating the surface of said wafer by thermally growing a passivating layer; and
forming metallic ohmic contacts on said wafer.

10. The method of controlling dislocation enhancement in a semiconductor device as described in claim 9, wherein said junctions produced are selected from the group consisting of $n^+$-n-p, $p^+$-p-n, n-p-n and p-n-p.

11. The method of controlling dislocation enhancement in a semiconductor device as described in claim 9, wherein said wafer is passivated by nitridization and oxidation.

12. The method of controlling dislocation enhancement in a semiconductor device as described in claim 9, wherein said wafer is passivated by nitridization.

13. The method of controlling dislocation enhancement as described in claim 6 in which a final passivating layer is grown over the surface and metallic contacts on said wafer.

14. The method of controlling dislocation enhancement in a semiconductor device as described in claim 9, wherein said wafer is passivated by oxidation.

15. The method as defined in claim 9, wherein the heavy metal element is selected from the group consisting of Ag, Au, Co, Cr, Cu, Fe, Ni and Zn.

16. A method of controlling dislocation enhancement in a semiconductor device comprising the steps of:
disposing a layer of nickel on the surface of a silicon wafer;
diffusing atoms of nickel into said silcon wafer at a temperature range of 800–1000° C.;
diffusing phosphorous and/or boron into said silicon wafer to produce a zone having a p-n characteristic; and
passivating the surface of said silicon wafer by thermally growing a layer of silicon dioxide.

References Cited

UNITED STATES PATENTS 3,440,113 4/1969 Wolley ............ 148—186

HYLAND BIZOT, Primary Examiner

U.S. Cl. X.R.

148—188, 189, 190